(12) United States Patent
Marshall, Jr. et al.

(10) Patent No.: US 8,581,765 B2
(45) Date of Patent: Nov. 12, 2013

(54) LOW-MEMORY-USAGE ARBITRARY WAVEFORM REPRESENTATION OR GENERATION

(75) Inventors: Jerry A. Marshall, Jr., Corvallis, OR (US); Roger N Switzer, Vancouver, WA (US)

(73) Assignee: Marvell World Trade Ltd., St. Michael (BB)

( * ) Notice: Subject to any disclaimer, the term of this patent is extended or adjusted under 35 U.S.C. 154(b) by 37 days.

(21) Appl. No.: 13/331,775

(22) Filed: Dec. 20, 2011

(65) Prior Publication Data

US 2012/0161996 A1    Jun. 28, 2012

Related U.S. Application Data

(60) Provisional application No. 61/426,763, filed on Dec. 23, 2010.

(51) Int. Cl.
*H03M 1/66*    (2006.01)
(52) U.S. Cl.
USPC .......................................... 341/147; 341/144
(58) Field of Classification Search
USPC .......... 341/144, 147, 137, 148; 327/105, 106, 327/107, 108, 261, 263, 266, 158, 298, 299, 327/269, 276
See application file for complete search history.

(56) References Cited

U.S. PATENT DOCUMENTS

| 4,064,423 | A | | 12/1977 | Atkisson, Jr. |
| 4,342,245 | A | | 8/1982 | Gross |
| 4,956,798 | A | * | 9/1990 | Dinteman ...................... 708/273 |
| 5,268,688 | A | * | 12/1993 | Meyers et al. ................ 341/143 |
| 2007/0067123 | A1 | | 3/2007 | Jungerman |

FOREIGN PATENT DOCUMENTS

WO    WO-2012088130    6/2012

OTHER PUBLICATIONS

"PCT Search Report and Written Opinion", Application No. PCT/US2011/066192, Aug. 3, 2012, 14 pages.

* cited by examiner

*Primary Examiner* — Joseph Lauture

(57) ABSTRACT

This disclosure describes techniques and apparatuses for low-memory-usage arbitrary waveform representation or generation. These techniques and/or apparatuses enable representation and/or generation of arbitrary waveforms using less memory than many current techniques, thereby reducing costs or memory size. Further, in some embodiments the techniques and apparatuses generate arbitrary waveforms without using processor resources.

20 Claims, 8 Drawing Sheets

LOW-MEMORY-USAGE ARBITRARY WAVEFORM REPRESENTATION OR GENERATION

RELATED APPLICATION

This present disclosure claims priority to U.S. Provisional Patent Application Ser. No. 61/426,763, filed Dec. 23, 2010, the disclosure of which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Currently, arbitrary waveform generators are capable of producing arbitrary waveforms based on digital data stored in memory that represent each point in the desired arbitrary waveform. These current arbitrary waveform generators often include memory in which to store the digital data for each point, a sequencer to retrieve the data from the memory and to provide the data in a sequence for the desired arbitrary waveform, and a digital-to-analog converter to receive the data from the sequencer and output an analog waveform based on the data. These current arbitrary waveform generators, however, often use significant amounts of memory, which can be expensive in terms of costs and chip space.

SUMMARY

This summary is provided to introduce subject matter that is further described below in the Detailed Description and Drawings. Accordingly, this Summary should not be considered to describe essential features nor used to limit the scope of the claimed subject matter.

A method is described that includes generating a representation of an arbitrary waveform with segments representing linear approximations of portions of the arbitrary waveform and storing the representation of the arbitrary waveform as the segments.

Another method is described that includes receiving a trigger to provide data points to a digital-to-analog converter and an initial value indicating an amplitude for an initial data point to the digital-to-analog converter, responsive to receiving the trigger, requesting, from a memory, cycle data, the cycle data indicating segment addresses for associated segment data, receiving, responsive to the request for the cycle data, the cycle data having the segment addresses, requesting, from the memory, a first of the segment data at a first of the segment addresses, receiving the first of the segment data responsive to the request, the first segment data indicating an increment and a count in the first segment, determining first data points for receipt by a digital-to-analog converter within the chip for each of the counts based on the initial value and the increment, providing the first data points to the digital-to-analog converter, requesting, from the memory, a second of the segment data at a second of the segment addresses, receiving the second of the segment data responsive to the request, the second segment data indicating a second increment and a second count in the second segment, determining second data points for receipt by the digital-to-analog converter for each of the second count based on a last-provided data point of the first data points and the second increment, and providing the second data points to the digital-to-analog converter effective to enable the digital-to-analog converter to create the cycle of the corresponding waveform.

An integrated hardware chip is described that includes memory having memory addresses, the memory addresses for locations in the memory, each of the locations capable of storing either segment data or cycle data, a finite state machine configured to query the memory with a memory address for a location, the location storing the cycle data, receive the cycle data, the cycle data indicating memory addresses for multiple segment data and an order of the memory addresses, query, according to the order, each of the multiple memory addresses, for each query of the multiple memory addresses: receive segment data, the segment data indicating a count and an increment; determine data points based on the count and the increment; and provide the data points to the digital-to-analog converter, and a digital-to-analog converter configured to receive the data points and, based on the data points, output an analog waveform.

BRIEF DESCRIPTION OF THE DRAWINGS

The detailed description is described with reference to the accompanying figures. In the figures, the left-most digit of a reference number identifies the figure in which the reference number first appears. The use of the same reference numbers in different instances in the description and the figures indicate similar or identical items.

DETAILED DESCRIPTION

Overview

This disclosure describes techniques and apparatuses for low-memory-usage arbitrary waveform representation or generation. These techniques and/or apparatuses enable representation and/or generation of arbitrary waveforms using less memory than many current techniques, thereby reducing costs or memory size. Further, in some embodiments the techniques and apparatuses represent and/or generate arbitrary waveforms without using processor resources.

As noted in part in the Background, a current arbitrary waveform generator may use too much memory, which is problematic generally but particularly in situations where chip real estate is expensive or constrained. This is also true of current ways in which to represent an arbitrary waveform. By way of example, consider a conventional arbitrary waveform generator capable of generating a triangle wave. Assume that that the memory storage width used in the conventional generator is 12-bit-wide memory for a 12-bit digital-to-analog converter operating at 10 MHz and creating a 10 kHz, full-scale triangle wave. In so doing the conventional generator uses 12,000 bits of memory storage for 1,000 points in each triangle.

The same triangle wave, however, if generated following the techniques and apparatuses described herein, can be defined using one repeating cycle having two segments. This definition can be stored in three memory locations, one for the cycle and one for each segment. If each is stored in a 32-bit-wide memory space, the total memory storage will be 96 bits compared to 12,000 bits in the conventional case. Thus, the memory resources used by the described techniques are less than one percent of the memory used by the conventional generator—a 99% savings. Various other examples, some of which save more memory and some less, are described herein.

In the discussion that follows, an operating environment having an example waveform generator is first described, though this example waveform generator is not intended to limit the techniques or claims herein. The techniques may also or instead represent arbitrary waveforms with low-memory usage independent of how, when, or if the arbitrary waveform is later generated based on these representations. Methods are then described that may be employed in the operating environment as well as other environments. Following the methods, an example apparatus is described. In the discussion below, reference will be made to the environment by way of example only and, therefore, implementations described below are not limited to the described environment.

Operating Environment

Figure 1:
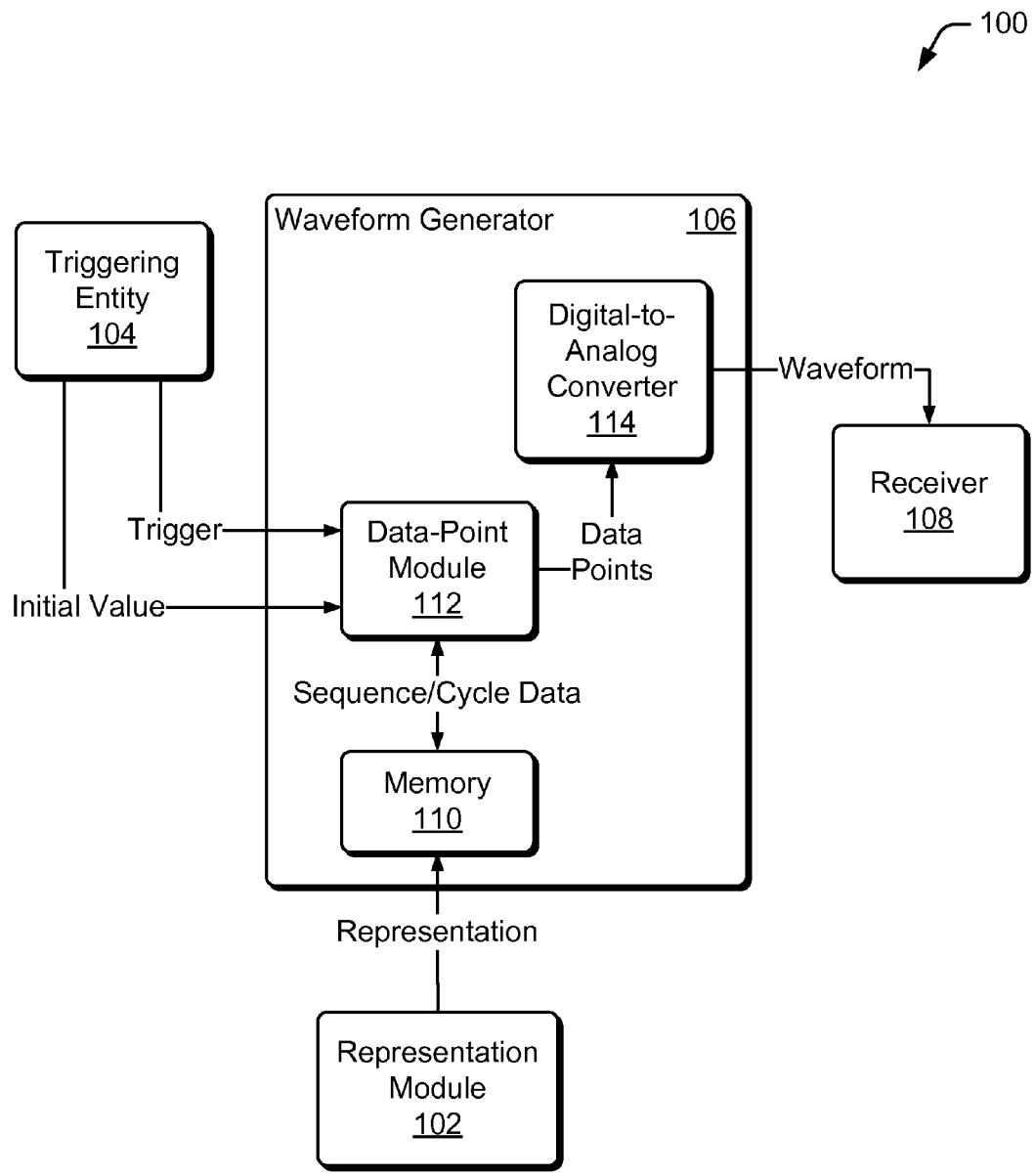
FIG. 1 illustrates an operating environment in which techniques for low-memory-usage arbitrary waveform representation or generation can be performed.

FIG. 1 illustrates an operating environment 100 having a representation module 102, a triggering entity 104, a waveform generator 106, and an analog waveform receiver 108 (receiver 108). Representation module 102 generates a low-memory-usage representation of a waveform, which can then be stored on memory 110. Representation module 102 can be integral or separate from waveform generator 106. Triggering entity 104 can be, or reside within, one of many different devices, such as a computing device in which waveform generator 106 resides. Triggering entity 104 sends a trigger to waveform generator 106 to initiate generation of a waveform. This waveform can be arbitrary, non-arbitrary, complex or simple, and repeating or non-repeating. Thus, the waveform can be simple and repeating—such as a sine wave, or complex and non-repeating. These techniques and apparatuses for low-memory-usage arbitrary waveform representation or generation are described in the context of waveforms that are arbitrary, complex, and/or non-repeating, though simple, repeating waveforms can be generated as well.

The trigger can be sent responsive to events, such as a point in time arriving (e.g., from a clock), a GPIO rising or falling edge, a signal received or generated based on serial input data, and/or other events whether set by a user or otherwise. In some cases triggering entity 104 also sends an initial value for the waveform, though this is not necessarily required.

Waveform generator 106 receives this trigger and generates the requested waveform, which waveform generator 106 provides to receiver 108. Receiver 108 can be one of many different types of entities, such as a speaker, actuator, or motor, to name just three. Waveform generator 106 includes one or more of a memory 110, a data-point module 112, and a digital-to-analog converter 114. Waveform generator 106 can be an integrated hardware chip not having a processor or instead include firmware, a processor, or other structures. In cases where an arbitrary waveform is represented and not necessarily generated, the representation or data points based on the representation may be provided to various entities other than a digital-to-analog converter, such as to a digital signal processing chain.

Memory 110 is configured to store segment and cycle data for use by data-point module 112. In some cases, memory 110 has 32-bit-wide locations, each of which can store segment or cycle data. Segment and cycle data will be described in greater detail below.

Data-point module 112 is configured to determine data points for receipt by digital-to-analog converter 114 based on cycle data and/or segment data stored in memory 110. In some cases data-point module 112 is a finite state machine, though this is not required. Ways in which data-point module 112 acts and interacts with other entities are set forth in detail below.

Digital-to-analog converter 114 receives data points provided by data-point module 112 effective to output an analog waveform. Digital-to-analog converter 114 can be one of various different digital-to-analog converters known in the art.

Methods for Representing and Generating Arbitrary Waveforms

This disclosure describes techniques for representing and/or generating arbitrary waveforms, including those having low memory usage. These techniques permit fewer memory resources to be used, thereby reducing costs and/or memory size. These techniques include various methods illustrated below, which may be used separately or in combination, in whole or in part. Aspects of these methods may be implemented in hardware, firmware, software, or a combination thereof. The methods are shown as a set of acts that specify operations performed by one or more entities and are not necessarily limited to the order shown.

Figure 2:
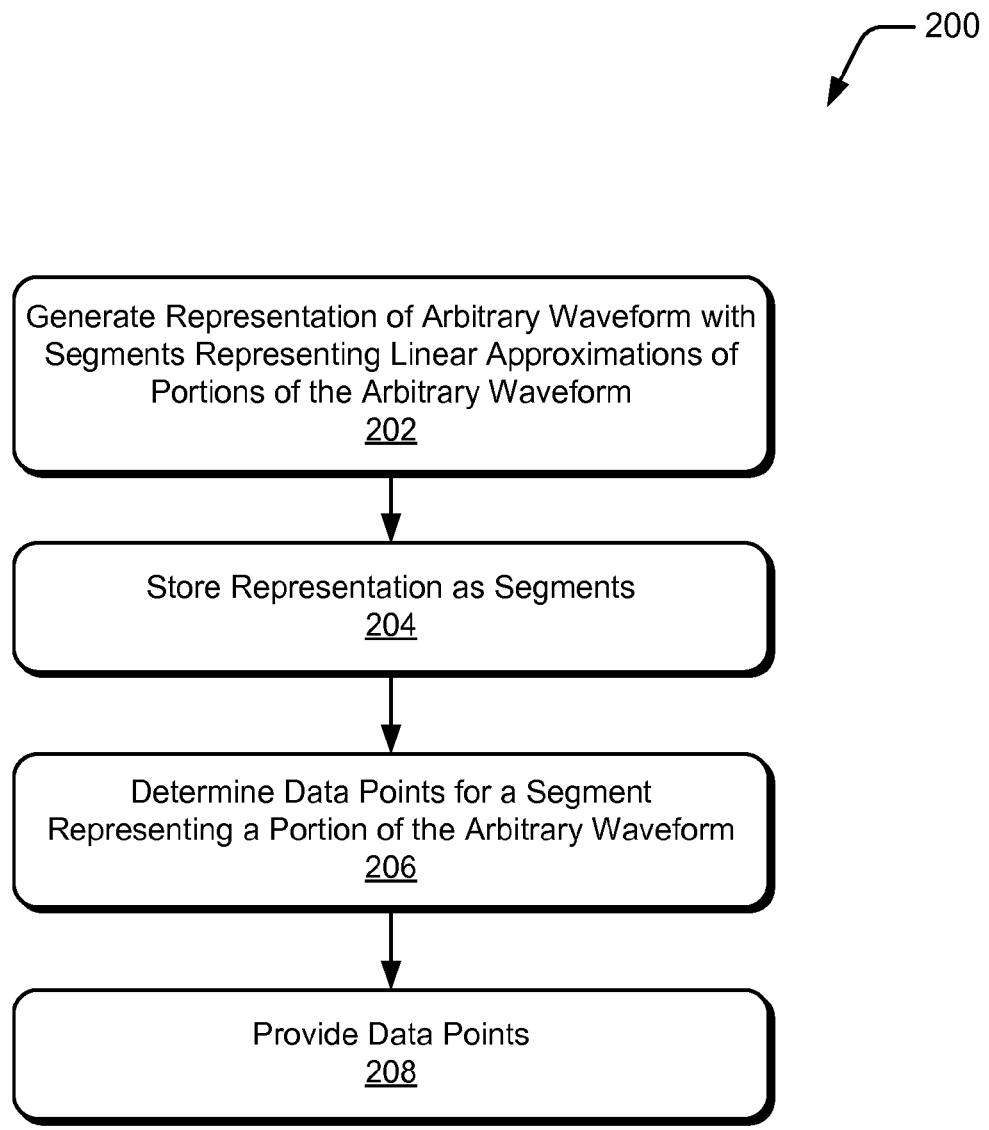
FIG. 2 illustrates a method for representing or generating an arbitrary waveform using segments representing portions of the desired arbitrary waveform.

FIG. 2 illustrates a method 200 for representing and/or generating an arbitrary waveform using segments representing portions of the desired arbitrary waveform.

At 202, a waveform representation is generated. The waveform representation can have low memory usage, even in cases where the waveform is complex or arbitrary. In one case, for example, representation module 102 generates a representation of a waveform having segments, each of the segments representing linear approximations of portions of the waveform. Ways in which this can be performed are described in greater detail below.

At 204, the waveform representation is stored. As noted, the memory usage used to store the waveform representation can be low. Continuing the ongoing example, assume that representation module 102 stores the representation as segments and in memory 110 of FIG. 1.

At 206, data points are determined. The data points are determined for a segment representing a portion of the desired arbitrary waveform based on an increment and count, which can be stored in memory local to or accessible by the digital-to-analog converter.

This segment represents a portion of the desired arbitrary waveform. With multiple segments, which may or may not be grouped into cycles (e.g., cyclical or periodic waveforms or portions thereof), data-point module 112 of FIG. 1 may provide data points effective to enable digital-to-analog converter 114 to generate the entire desired arbitrary waveform with low memory usage.

Figure 3:
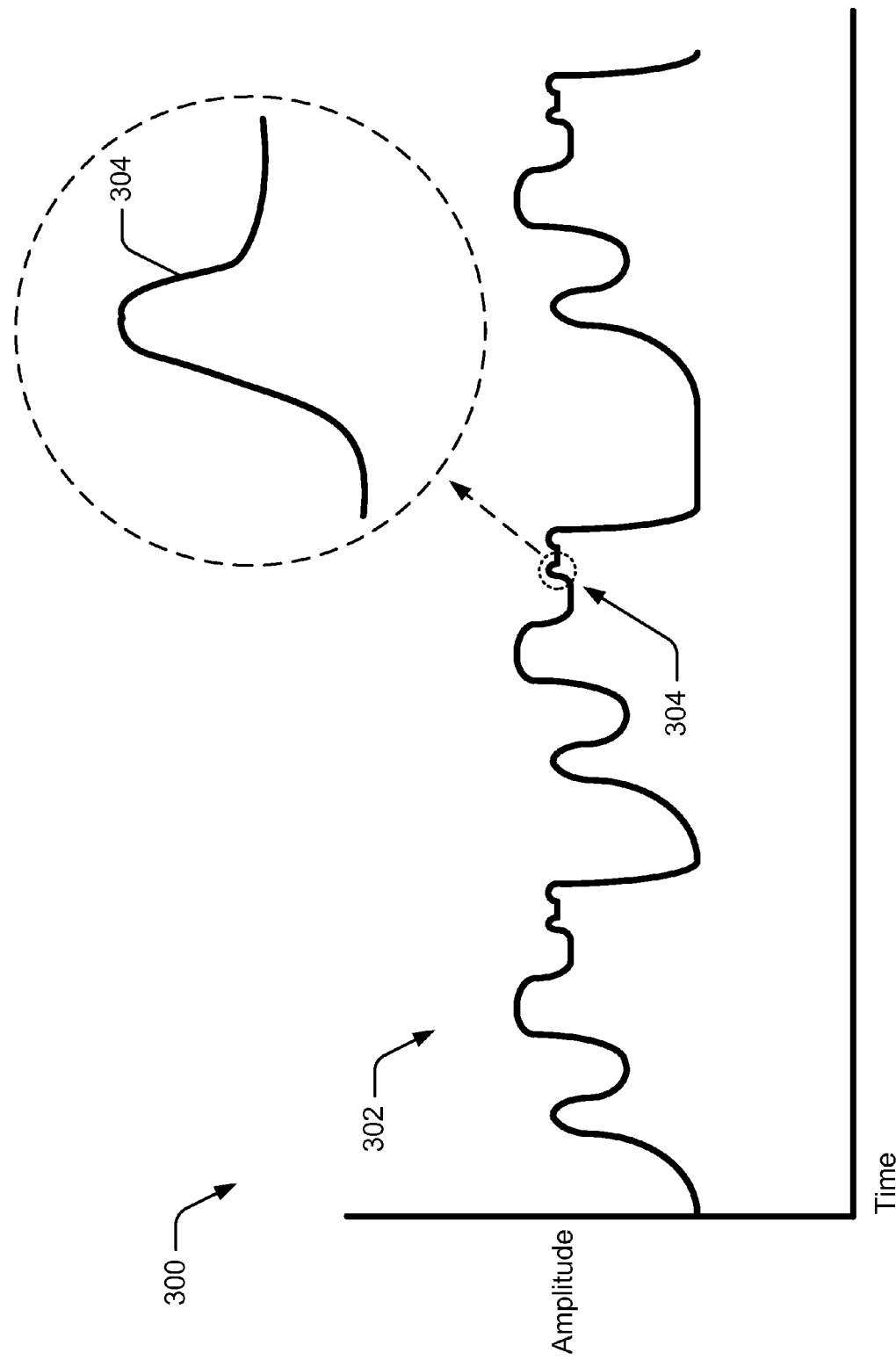
FIG. 3 illustrates an amplitude-versus-time graph showing a complex, irregularly repeating waveform having a waveform part.
Figure 4:
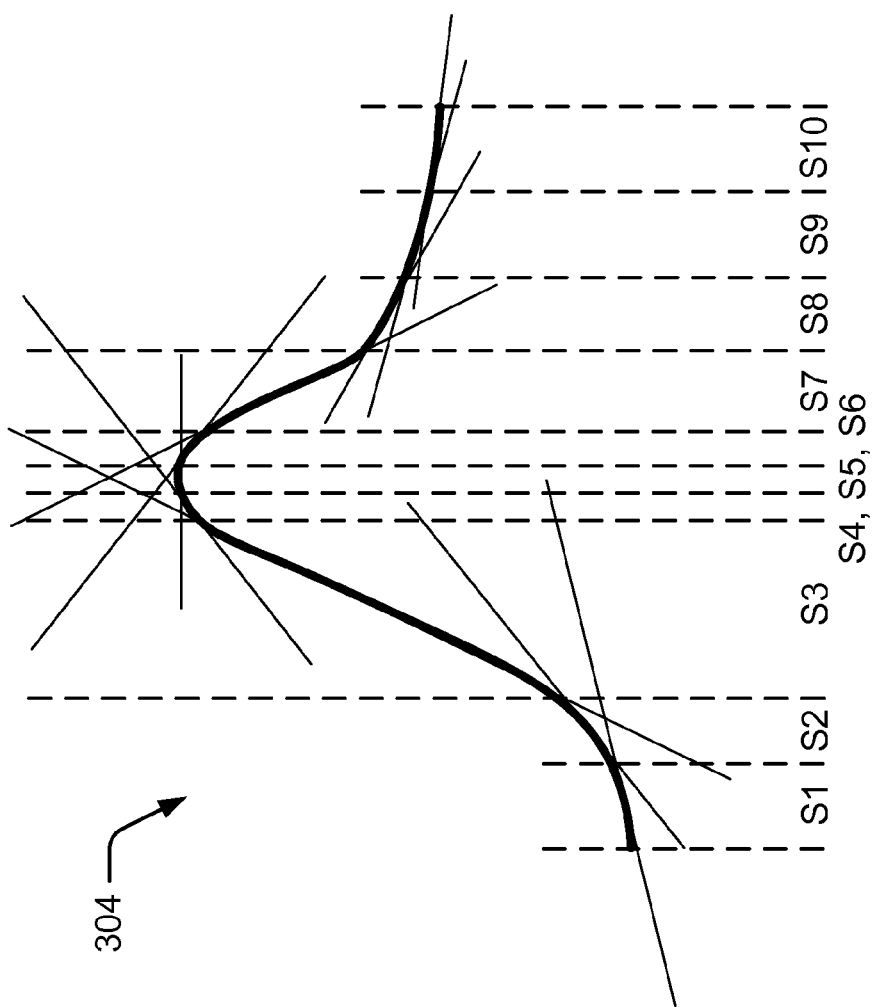
FIG. 4 illustrates the waveform part of FIG. 3 broken into ten portions, each of the ten portions having a representative segment that is a piece-wise-linear approximation of the corresponding portion.
Figure 5:
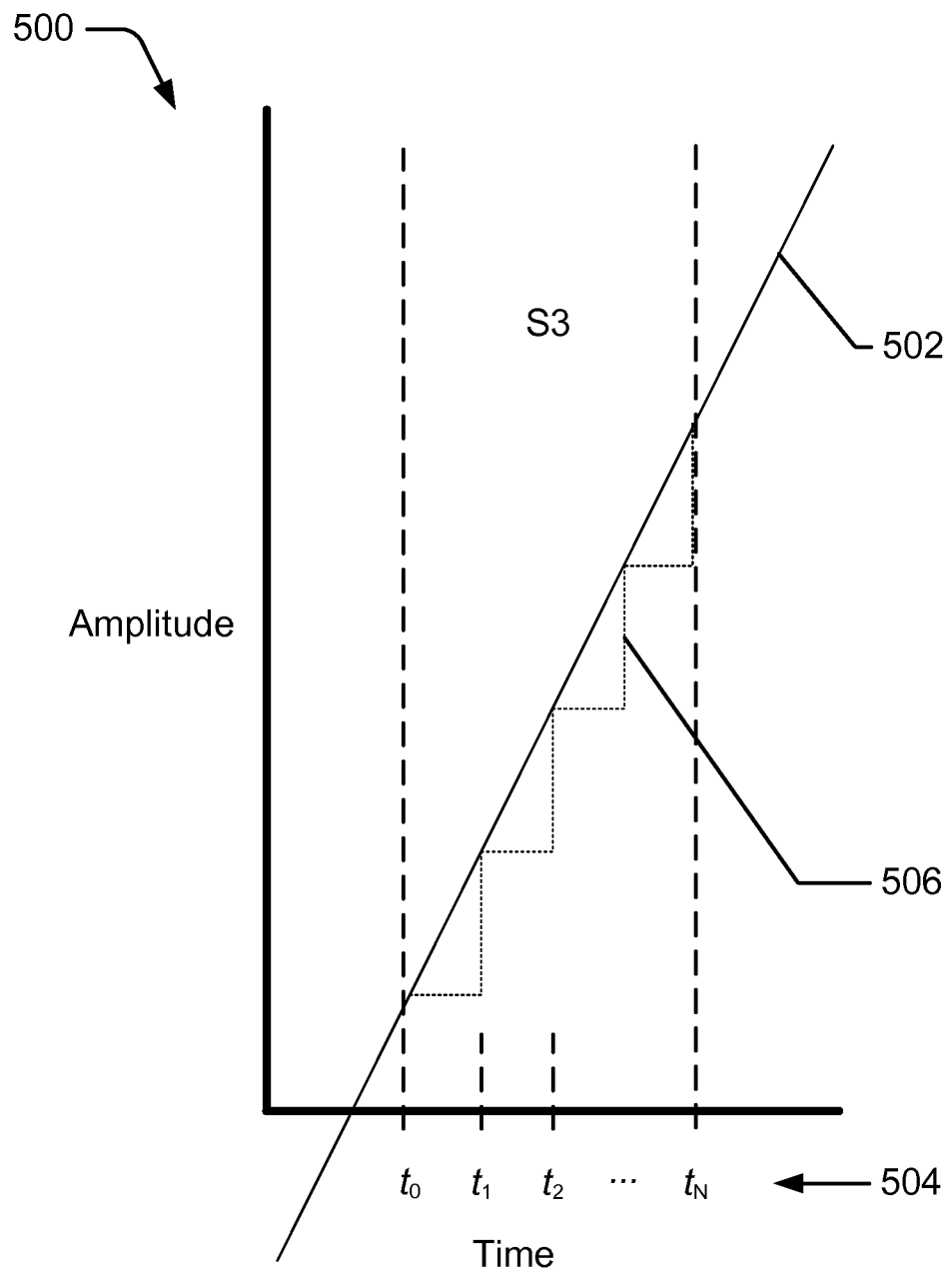
FIG. 5 illustrates an amplitude-versus-time graph having a linear-approximation line for a segment of the waveform part of FIGS. 3 and 4.

Consider, for example, FIGS. 3, 4, and 5, which illustrate an example manner in which an arbitrary waveform can be represented by multiple segments. FIG. 3 illustrates an amplitude-versus-time graph 300 showing a complex, irregularly repeating waveform 302 having a waveform part 304. Waveform part 304 is a small part of waveform 302 expanded to show detail.

FIG. 4 illustrates waveform part 304 of FIG. 3 broken into ten portions, each of the ten portions having a representative segment S1, S2, S3, S4, S5, S6, S7, S8, S9, and S10 that is a piece-wise-linear approximation of the corresponding portion. Each of these segments can be represented in memory with as little as a count (e.g., a number of time points) and an increment (e.g., an amplitude change at each time point). This is illustrated in FIG. 5, which shows an amplitude-versus-time graph 500 having a linear-approximation line 502 for segment S3 of FIG. 4, "N" counts 504 (from time t=0 to N), and an increment 506). Note that a count may be based on any interval of time, such as a multiple or fraction of a suitable time unit (e.g., seconds, milli-seconds, micro-seconds, or nano-seconds). Additionally or alternately, an increment may be specified in any suitable unit of voltage or power (e.g., volts or dBm).

Thus, as illustrated in the example of FIGS. 3-5, a segment includes an increment and a count sufficient to approximate a portion of a waveform. While not addressed in detail here, segments can be grouped into cycles, which saves memory in cases where cycles are repeated. As shown in FIG. 3, waveform 302 can be represented by a cycle repeated, irregularly, three times, though it can also be broken into many more cycles, such as for a cycle for smaller portions, such as waveform part 304.

In some cases the portion of the waveform is linear enough or the count is small enough that the segment's increment and count are as accurate as storing each point for the waveform in memory. In some further cases, even if the segment's increment and count are not exactly the same as storing each data point for the portion, the result, such as a carrier wave or analog waveform (e.g., the analog waveform produced by the digital-to-analog converter) may be the same as, or as accurate as, conventional methods that store data for each data point. In cases where an analog waveform is generated, this can be due to the resolution at which the digital-to-analog converter is able to reproduce or receive, as well as other factors. In still other cases the analog waveform produced can be slightly less accurate but without negative effects.

Returning to method 200 of FIG. 2, at 208, the data points are provided. As noted above, data points or the segments representing the waveform can be stored for later use and/or provided to various entities. In the ongoing example, the data points are provided to a digital-to-analog converter. The amplitude of each of these data points changes, relative to a prior of the data points, by the increment (unless the increment is zero). The data points are effective to enable the digital-to-analog converter to output the portion of the desired arbitrary waveform.

While the above example of FIGS. 3-5 shows one segment of a portion of a waveform, method 200 may be repeated. Thus, data-point module 112 of FIG. 1, for example, may represent and/or determine multiple other sets of data points, each of the multiple other sets of data points for another segment representing another portion of the desired arbitrary waveform and based on another increment and another count stored in the memory local to the digital-to-analog converter.

Further, block 202 of method 200 may represent a waveform using repeated sets of segments arranged into repeating cycles, which blocks 206 and 208 may then handle. Thus, data-point module 112 may repeat blocks 206 and 208 of method 200 for the ten segments of FIG. 4 as a cycle or portion of a cycle and then do so again for the same cycle or other cycles. As noted above, each cycle may represent some repeating portion or super-portion of the desired arbitrary waveform. These cycles can be the same or different. Consider again waveform 302 of FIG. 3. The techniques may represent waveform 302 with one cycle repeated three times, a second cycle for the irregularity between the second and third cycle, and same segments for each of the first cycle. In some cases, however, the techniques may instead have many cycles, such as 5 different cycles, four that are repeated three times (one for each "hump" in the three similar super-portions of waveform 302) and the fifth for the flat section of waveform 302 between the second and third similar super-portions.

Not only can cycles be repeated, thereby potentially saving memory, but segments may also be repeated. Segment S3 of FIG. 4, for example, may be repeated to represent another portion of waveform 302. Assuming segment S3 is saved in memory fewer times that it is used, repeating segment S3 saves memory.

Also, if this other portion is larger (has more counts) than that of S3 of FIG. 4, the segment may be repeated for just that other portion. Assume that the count of S3 is 4 and the increment is 3.7. If another portion of waveform 302 has an increment of 3.7 and a count of 28, data-point module 112 may repeat segment S3 7 times (28/4=7) to cause digital-to-analog converter 114 to create this other portion. These savings due to reusing segments can be gained whether or not a waveform includes a repeating cycle. Assume that a particular waveform does not repeat, is 10,000 counts long, and can be approximated with 100 segments (e.g., 50 positive and 50 negative increments having 10 counts each). The techniques may represent and then store this waveform in 100 memory locations along with the memory needed to create the order for the segments (a list of 1,000 segment addresses in this case). This represents a substantial savings over storing 10,000 data points. The techniques may select to store as many segments as there are locations in memory 110 (minus locations to store the order, which can be as small as one) to add accuracy in the approximations, such as to store 200 segments if there is sufficient memory. By so doing, accuracy is improved using all local, available memory.

Data-point module 112 may reuse segments even when the starting amplitude of the different portions is also different. This is described in greater detail below.

Figure 6:
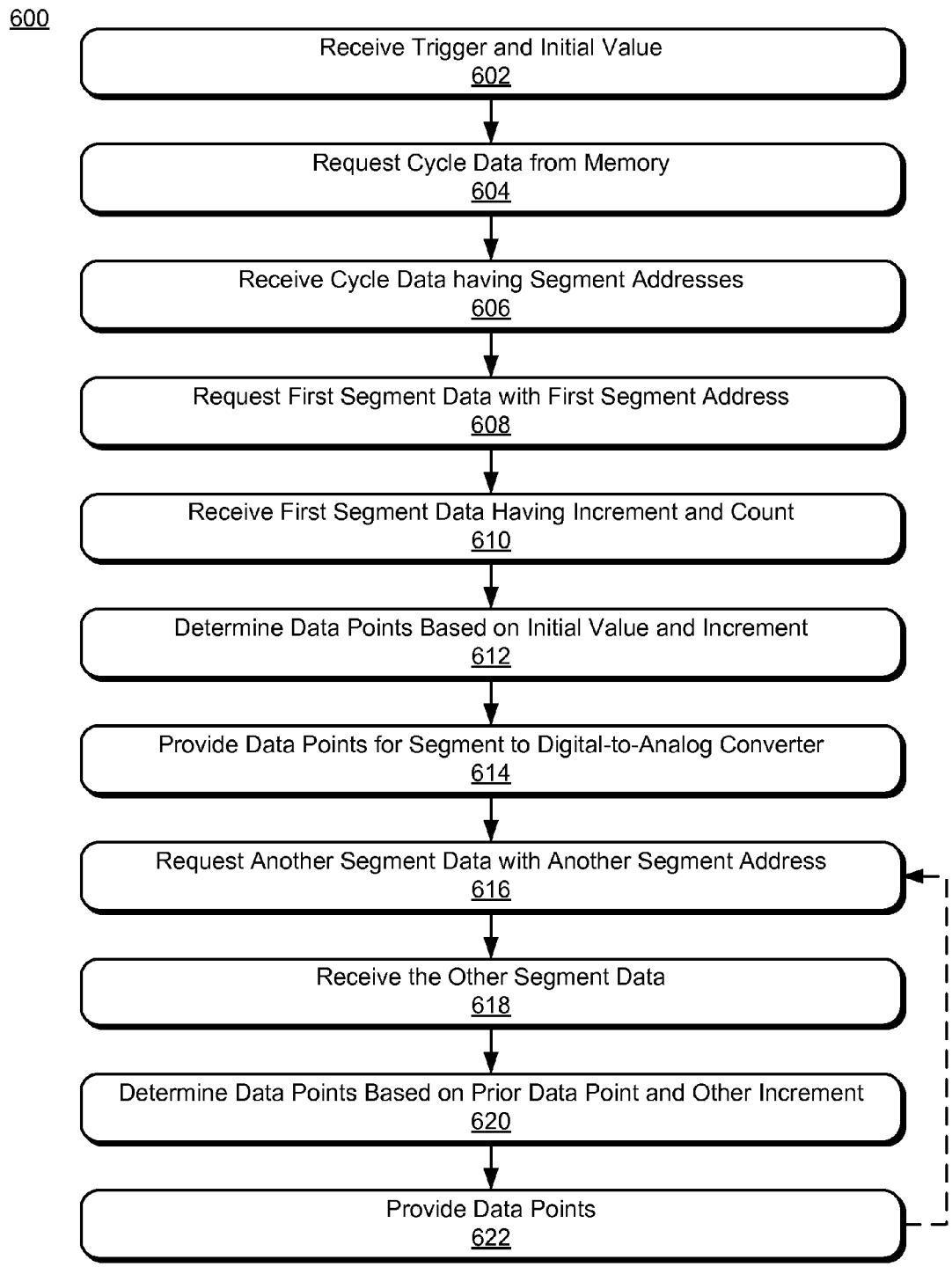
FIG. 6 illustrates a method for generating an arbitrary waveform responsive to a trigger and based on an initial value, cycle data, and segment data.

FIG. 6 illustrates a method 600 for generating an arbitrary waveform responsive to a trigger and based on an initial value, cycle data, and segment data. The cycle data and segment data are a representation of a waveform and can be generated as noted elsewhere herein.

At 602, a trigger is received to provide data points to a digital-to-analog converter. The trigger may indicate simply a command to begin generating a waveform or include information useful to begin generating the waveform, such as a cycle address. Separately or with the trigger an initial value is also received, the initial value indicates an amplitude for an initial data point to the digital-to-analog converter. Assume, for example, that data-point module 112 receives both the trigger and the initial value from triggering entity 104 and that the trigger includes a cycle address in memory 110. The cycle address is to a location in memory 110 at which cycle data is stored.

At 604, cycle data is requested from a memory. Here data-point module 112 queries memory 110 for cycle data based on the cycle address received in the trigger. This cycle data includes segment addresses for associated segment data. The cycle data may explicitly include a segment order (e.g., a list) for the associated segment addresses or data, an arrangement of the segment addresses, or data implicitly indicating this segment order. Thus, data-point module 112 may explicitly follow this segment order, repeating various parts of method 600 for each segment in the segment order, or be configured to follow an implicit segment order within the cycle data.

Figure 7:
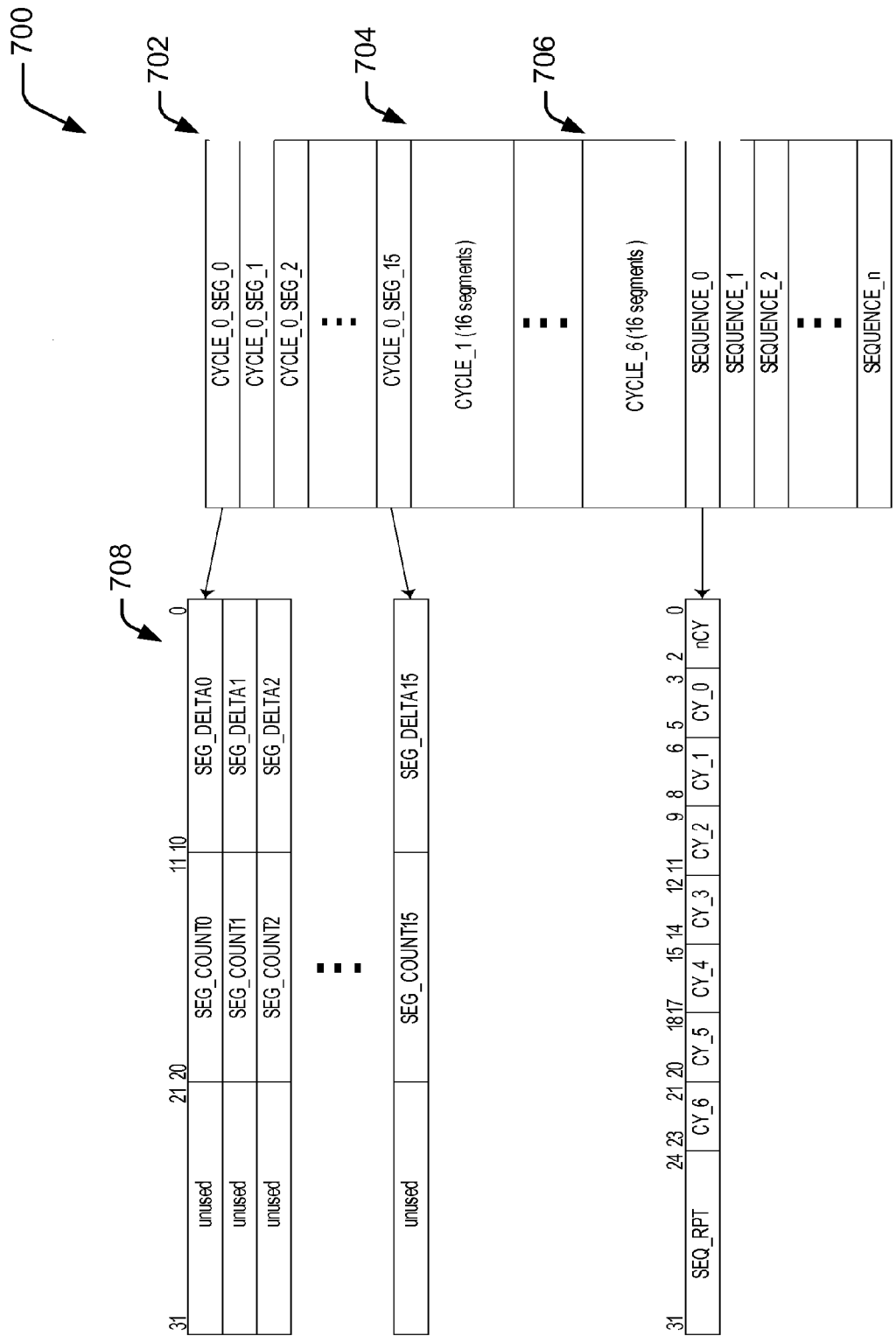
FIG. 7 illustrates a waveform memory structure in which sequence and cycle data is stored.

By way of example, consider FIG. 7, which illustrates waveform memory structure 700 in which sequence and cycle data is stored. The waveform is represented in waveform memory structure 700 with seven cycles, cycle 0 at 702, cycle 1 at 704, and cycle 6 at 706 (cycles 2 through 5 omitted for brevity). Thus, at 602, data-point module 112 receives a cycle address (e.g., "CYCLE_PTR") from which to request cycle data. At 604, data-point module 112 requests the cycle data using the cycle address.

At 606, the cycle data having segment addresses is received responsive to the request for the cycle data. Here data-point module 112 receives the indication that there are 16 segments and locations in memory for those segments and the order for the segments. Note that data-point module 112 may receive segment addresses one at a time (in which case the order is implicit) rather than concurrently. Segment data for the first cycle is shown at first segment data 708 at 16 locations in memory, each of the locations being 32-bits wide.

At 608, a first of the segment data is requested using a first of the segment addresses from the memory. Here data-point module 112 queries memory 110 with a first segment address according to the order. As noted above, segment data indicates an increment and a count. This increment is of some constant amount and the count is an integer, as shown for example at first segment data 708.

At 610, the first of the segment data is received responsive to the request, the first segment data indicating an increment and a count. The techniques, in some embodiments, behave differently at the first segment of the first cycle than subsequent cycles. The initial value can be included in memory, whether associated with the first segment or otherwise, or can be received by an external entity, such as triggering entity 104 of FIG. 1. For the ongoing example, assume that the initial value is received at 602.

At 612, data points are determined for receipt by a digital-to-analog converter for each of the counts based on the initial value and the increment. The first of the data points in this example, is determined by data-point module 112 based on the initial value received. The following data points in the segment (here the next 15 counts of the 16 total counts in the first segment) are incremented by one increment relative to the prior data point.

This can be shown in equation format as follows, with D=Data Point, I=Increment, V=Initial Value, N=Count:

$$D_{0\ to\ N} = V, V+I, V+2*I, \ldots, V+N*I$$

Data-point module 112, however, does not need to retain information other than the prior data-point, the increment, and the count (or a decrement of the count) to determine a current data point up to N data points. As noted above, data-point module 112 may do so without assistance from a computer processor. Furthermore, this is also true for different segments or different cycles, in which case a first data point of a succeeding segment (whether in the same cycle or not) is the last data point of the current segment is used as an initial value.

At 614, the data points are provided to the digital-to-analog converter. These data points can be provided one at a time (e.g., serially), as noted above. These data points are effective to enable a digital-to-analog converter to generate a portion of an analog waveform corresponding to the segment, as described above.

At 616, another segment data at another segment addresses is requested from the memory. Data-point module 112 may do so similarly as to set forth at 608, though with the next segment data in the segment order.

At 618, the other segment data is received responsive to the request, the other segment data indicating another increment and another count for the other segment. As noted in part above, in some cases segments are reused or repeated for a same portion of a waveform. In such a case the first increment and the second increment (and count) can be the same. In many cases, as in the current example shown in FIG. 7, the increment changes for the next segment in the cycle. Here data-point module 112 creates data points, the first of the data points based on the other increment and the last data point of the prior segment, rather than a received initial value at 602.

At 620, other data points are determined for receipt by the digital-to-analog converter for each of the other count based on a final data point of an immediately prior segment and the other increment.

At 622, the other data points are provided to the digital-to-analog converter effective to enable the digital-to-analog converter to create the cycle of the corresponding waveform. Here data points for the remainder of the segments in the cycle can be determined and provided to the digital-to-analog converter, such as 16 segments shown in FIG. 7. This is performed by repeating 616, 618, 620, and 622 for the segments other than the first segment of the cycle, shown with dashed a dashed line in method 600. For subsequent cycles, however, the first segment uses an initial value as the last data point of the prior cycle, rather than a received initial value or a last data point of the prior segment. In some embodiments, data-point module 112 determines to proceed to another cycle based on a last segment of the current cycle having a zero count. Thus, the last segment is a marker to move to another cycle rather than determine data points.

The techniques can continue to determine data points indefinitely (for continuous waveform generation) or stop at some point. In some cases data-point module 112 receives a cycle count in the trigger. In such a case data-point module 112 decrements the cycle count when each cycle is complete and, when the cycle count reaches zero, ceases. In some cases, however, data-point module 112 repeats one or more cycles indefinitely or until receiving another trigger.

Note that one or more of the entities shown in FIG. 1, such as triggering entity 104, waveform generator 106, data-point module 112, or digital-to-analog converter 114 may be further divided, combined, and so on. Each of these entities can be hardware, software, firmware, or a combination thereof, and/or stored on computer-readable-media and executed by one or more processors.

Example System-on-Chip for Representing or Generating Arbitrary Waveforms

As noted above, the described techniques for low-memory-usage arbitrary waveform representation or generation can be performed with an integrated hardware chip having representation module 102 and/or memory 110, data-point module 112, and digital-to-analog converter 114. In some embodiments, however, the techniques can be performed with other apparatuses, such as a system-on-chip, in whole or in part.

Figure 8:
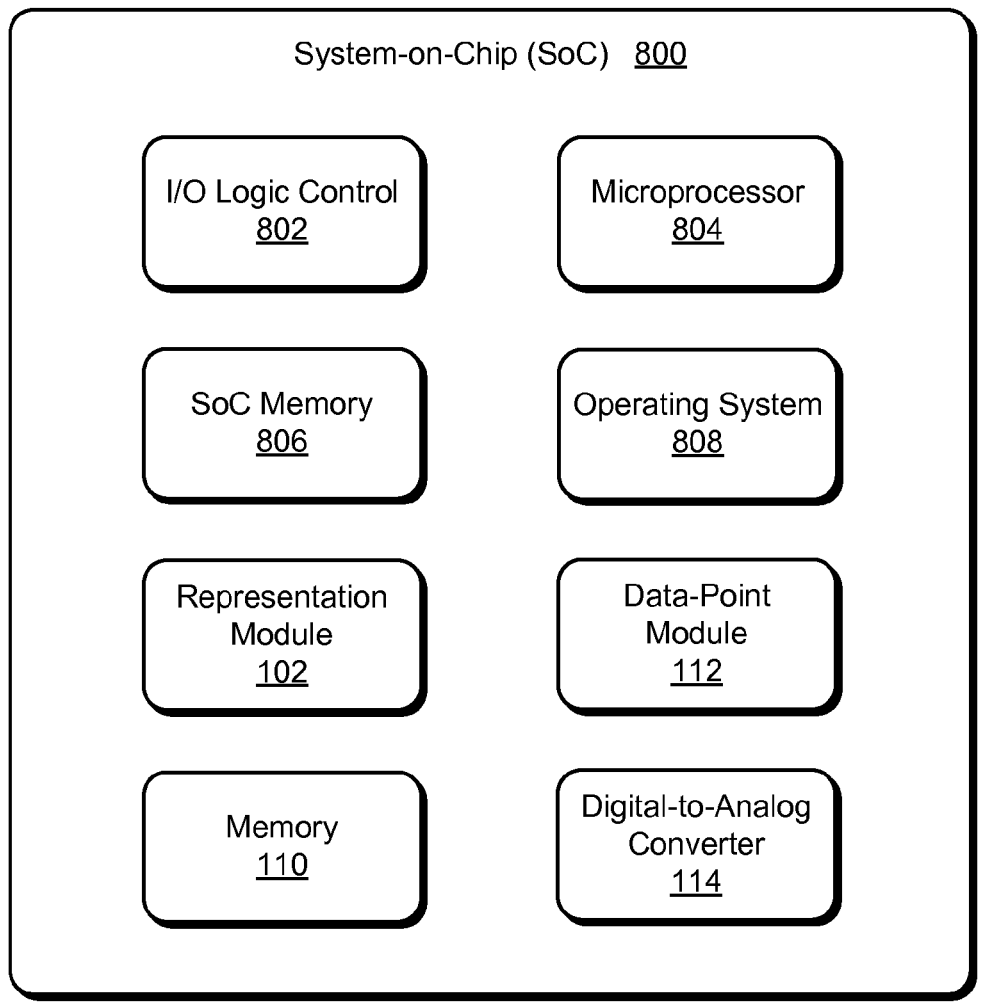
FIG. 8 illustrates a System-on-Chip that is capable of low-memory-usage arbitrary waveform representation or generation.

FIG. 8 illustrates such a case, with an example System-on-Chip (SoC) 800. An SoC can be implemented in a fixed or mobile device, such as any one or combination of a computer device, television set-top box, video processing and/or rendering device, Ethernet interface, switch, appliance device, gaming device, electronic device, vehicle, workstation, and/or in any other type of device that may transmit or receive packets in one or more packet streams.

SoC 800 can be integrated with electronic circuitry, a microprocessor, memory, input-output (I/O) logic control, communication interfaces and components, other hardware, firmware, and/or software needed to run an entire device. SoC 800 can also include an integrated data bus (not shown) that couples the various components of the SoC for data communication between the components. A device that includes SoC 800 can also be implemented with many combinations of differing components.

In this example, SoC 800 includes various components such as an input-output (I/O) logic control 802 (e.g., to include electronic circuitry) and a microprocessor 804 (e.g., any of a microcontroller or digital signal processor). SoC 800 also includes SoC memory 806, which can be any type of random access memory (RAM), a low-latency nonvolatile memory (e.g., flash memory), read only memory (ROM), and/or other suitable electronic data storage. SoC memory 806 may be separate from (shown) or integrated with (not shown) memory 110 depending on the architecture of SoC 800. SoC 800 can also include various firmware and/or software, such as an operating system 808, which can be computer-executable instructions maintained by SoC memory 806 and executed by microprocessor 804. SoC 800 can also include other various communication interfaces and components, wireless LAN (WLAN) or PAN (WPAN) components, other hardware, firmware, and/or software.

SoC 800 may include representation module 102, memory 110, data-point module 112, and digital-to-analog converter 114 of FIG. 1. These entities and their corresponding functionality are described with reference to the respective components of the example environment 100 shown in FIG. 1.

Although the subject matter has been described in language specific to structural features and/or methodological techniques and/or acts, it is to be understood that the subject matter defined in the appended claims is not necessarily limited to the specific features, techniques, or acts described above, including orders in which they are performed.

What is claimed is:

1. A method comprising:
generating a representation of an arbitrary waveform with segments representing linear approximations of portions of the arbitrary waveform;
storing the representation of the arbitrary waveform as the segments;
determining data points to provide to a digital-to-analog converter for one of the segments, the one of the segments representing one of the portions of the arbitrary waveform, the data points based on an increment and a count stored in memory local to the digital-to-analog converter; and
providing the data points to the digital-to-analog converter, each of the data points incrementing from a prior of the data points by the increment and at the count, the data points effective to enable the digital-to-analog converter to output the portion of the arbitrary waveform.

2. The method as recited in claim 1, wherein the data points are a first set of data points and further comprising determining multiple other sets of data points, each of the multiple other sets of data points for another of the segments and representing another portion of the portions the arbitrary waveform and based on another increment and another count stored in the memory local to the digital-to-analog converter.

3. The method as recited in claim 2, wherein the first set of data points and the multiple other sets of data points represent a repeating super-portion of the arbitrary waveform, and further comprising repeating the determining and the providing one or more times effective to enable the digital-to-analog converter to repeatedly generate the super-portion.

4. The method as recited in claim 2, wherein the first set of data points and the multiple other sets of data points represent a super-portion of the arbitrary waveform, and further comprising repeating the determining and the providing for another, different super-portion of the arbitrary waveform.

5. The method as recited in claim 4, wherein the super-portion and the other, different super-portion are represented in part by a same segment of the segments stored in a single location of the memory.

6. The method as recited in claim 5, wherein the same segment represents a first portion of the super-portion and a second portion of the other super-portion and the first portion and the second portion have a same rate of change but a different starting amplitude.

7. The method as recited in claim 1, wherein determining the data points is determined without intervention by a processor.

8. The method as recited in claim 1, wherein determining the data points is determined by a finite state machine local to the digital-to-analog converter and the memory, the finite state machine, the digital-to-analog converter, and the memory on a same, integrated hardware chip.

9. The method as recited in claim 1, wherein the increment and the count for the one of the segments is stored in a same location in the memory.

10. The method as recited in claim 1, wherein providing the data points to the digital-to-analog converter provides one of the data points incrementing from the prior of the data points by an increment that is zero.

11. An integrated hardware chip comprising:
memory having memory addresses, the memory addresses for locations in the memory, each of the locations capable of storing either segment data or cycle data;
a finite state machine configured to:
query the memory with a memory address for a location, the location storing the cycle data;
receive the cycle data, the cycle data indicating memory addresses for multiple segment data and an order of the memory addresses;
query, according to the order, each of the multiple memory addresses, for each query of the multiple memory addresses:
receive segment data, the segment data indicating an increment and a count;
determine data points based on the increment and the count; and
a digital-to-analog converter configured to receive the data points and, based on the data points, output an analog waveform.

12. The integrated hardware chip of claim 11, wherein the memory locations are 32-bits wide.

13. A method comprising:
receiving a trigger to provide data points to a digital-to-analog converter and an initial value indicating an amplitude for an initial data point to the digital-to-analog converter;
responsive to receiving the trigger, requesting, from a memory co-located with the digital-to-analog converter within a chip, cycle data, the cycle data indicating segment addresses for associated segment data;

receiving, responsive to the request for the cycle data, the cycle data having the segment addresses;

requesting, from the memory, a first of the segment data at a first of the segment addresses;

receiving the first of the segment data responsive to the request, the first segment data indicating an increment and a count in the first segment;

determining first data points for receipt by the digital-to-analog converter for each of the counts based on the initial value and the increment;

providing the first data points to the digital-to-analog converter;

requesting, from the memory, a second of the segment data at a second of the segment addresses;

receiving the second of the segment data responsive to the request, the second segment data indicating a second increment and a second count in the second segment;

determining second data points for receipt by the digital-to-analog converter for each of the second count based on a last-provided data point of the first data points and the second increment; and providing the second data points to the digital-to-analog converter effective to enable the digital-to-analog converter to create the cycle of the corresponding waveform.

14. The method as recited in claim 13, further comprising:
requesting, from the memory, a third of the segment data at a third of the segment addresses;

receiving the third of the segment data responsive to the request, the third segment data indicating a zero count;

responsive to the zero count, requesting second cycle data from the memory, the second cycle data indicating other segment addresses for associated other segment data; and providing other data points to the digital-to-analog converter effective to enable the digital-to-analog converter to create the second cycle of the corresponding waveform.

15. The method as recited in claim 13, wherein the method is performed by a finite state machine.

16. The method as recited in claim 13, wherein the method is performed at least in part by a processor.

17. The method as recited in claim 13, wherein the trigger indicates a cycle address in the memory, the cycle address a location in the memory at which cycle data is stored, and wherein requesting the cycle data requests data at the cycle address.

18. The method as recited in claim 13, wherein the cycle data indicates a segment order of the segment addresses and requesting the first of the segment data and the second of the segment data is based on the segment order.

19. The method as recited in claim 13, wherein the cycle includes an arbitrary number of segments up to one less than a total number of addresses in the memory.

20. The method as recited in claim 13, wherein the corresponding waveform includes multiple repetitions of the cycle, and the method repeats for each of the multiple repetitions of the cycle.

* * * * *